(12) United States Patent
Shank et al.

(10) Patent No.: US 6,904,381 B2
(45) Date of Patent: Jun. 7, 2005

(54) TESTING OF A FREQUENCY CONVERTER DEVICE

(75) Inventors: Eric Alan Shank, Sebastopol, CA (US); Alan B. Sauls, Santa Rosa, CA (US); Niels Jensen, Santa Rosa, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 55 days.

(21) Appl. No.: 10/383,910

(22) Filed: Mar. 7, 2003

(65) Prior Publication Data

US 2004/0176923 A1 Sep. 9, 2004

(51) Int. Cl.[7] ............................................... G06F 19/00
(52) U.S. Cl. ........................... 702/108; 702/75; 702/76; 702/68
(58) Field of Search ............................ 702/108, 68, 75, 702/76

(56) References Cited

U.S. PATENT DOCUMENTS

| | | | | |
|---|---|---|---|---|
| 5,434,954 A | * | 7/1995 | Kawauchi et al. | 345/440 |
| 5,579,463 A | * | 11/1996 | Takano et al. | 345/440 |
| 5,937,006 A | * | 8/1999 | Clark et al. | 375/224 |
| 6,041,077 A | * | 3/2000 | Clark et al. | 375/224 |
| 6,064,694 A | * | 5/2000 | Clark et al. | 375/224 |
| 6,316,928 B1 | * | 11/2001 | Miyauchi | 324/76.27 |
| 6,316,945 B1 | * | 11/2001 | Kapetanic et al. | 324/623 |
| 6,396,287 B1 | * | 5/2002 | Kapetanic et al. | 324/623 |
| 6,529,844 B1 | * | 3/2003 | Kapetanic et al. | 702/85 |
| 6,590,399 B1 | * | 7/2003 | Karl et al. | 324/637 |
| 6,766,262 B2 | * | 7/2004 | Martens | 702/69 |
| 2002/0121892 A1 | * | 9/2002 | Vandersteen et al. | 324/118 |
| 2003/0045261 A1 | * | 3/2003 | Karlquist | 455/318 |
| 2003/0144827 A1 | * | 7/2003 | Yang | 703/20 |
| 2004/0066182 A1 | * | 4/2004 | Evers et al. | 324/76.23 |

OTHER PUBLICATIONS

Rohde & Schwarz, Application Note 1EZ31_1E, "Measurements on Frequency–Converting DUTs using Vector Network Analyzer ZVR", May 29, 1998.*

Anritsu, 37000 Series Vector Network Analyzer, Application Note, "Measuring Frequency Conversion Devices", Apr. 1998.*

Rohde & Schwarz, Application Note 1EZ50_0E, "Conversion Gain Measurements on Mixers with Different Input and Output Impedances", unknown date.*

Jones, "Testing Frequency Multipliers and Dividers", Feb. 2000.*

User's Guide HP 8753ET HP 8753ES Network Analyzers; Hewlett–Packard Company; HP Part No. 875390472, 1999. Available from Agilent Technologies, Inc.

Albert Gleissner, *Using the Frequency Conversion Mode of Vector Network Analyzer ZVR*; Application Note 1EZ47_0E, Jan. 1999, Products ZVRL, ZVRE, ZVR, ZVC, ZVCE with Option ZVR–B4. Rohde & Schwarz.

* cited by examiner

*Primary Examiner*—Patrick Assouad (57) ABSTRACT

A user interface is presented for a tester that tests a frequency converter having an input port, an output port and a local oscillator port. In a first area, a user can specify frequency for an input signal to be placed on the input port. In a second area, the user can specify frequency for a local oscillator signal to be placed on the local oscillator port. The tester calculates expected frequency values of an output signal on the output port output based on values entered in the first area and the second area.

26 Claims, 9 Drawing Sheets

MIXER SETUP

| | | | | |
|---|---|---|---|---|
| 31 — Input | -17.000 dBm | Start/Stop ▶ | 3.543223416 GHz | 6.435678730 GHz |
| 32 — LO1 | 836XX Source | Fixed ▶ | 9.834773200 GHz | |
| 33 — IF = [1] X Input +/- [3] X LO1 = [1] | | Start/Stop ▶ ⊙ + | 33.04754301 GHz | 35.93999833 GHz |
| | | Start/Stop ▶ ○ − | 6.291549784 GHz | 3.399094470 GHz |
| 34 — LO2 | 9.000 dBm | Fixed ▶ | 8.544234017 GHz | |
| 35 — Output = [1] X Input +/- [1] X LO2 = [1] | | Start/Stop ▶ ⊙ + | 41.59177703 GHz | 44.48423234 GHz |
| | | Start/Stop ▶ ○ − | 4.833762599 GHz | 7.726217913 GHz |

36 — Hide Diagrams    LOs: ○1  ○3
                          ⦿2  ○4

[Load]  [Save...]  [Apply]  [OK]  [Cancel]  [Help]

38 — Calculate IF & Output
39 — Calculate In & Output
40 — Calculate Input & IF

37 — Input
Start: 3.543223416 GHz
Stop: 6.435678730 GHz
Power: -17.000 dBm x 1/1 — ⊗ — x 3/1 — In+LO
LO1
Start: 9.834773200 GHz
Stop: 9.834773200 GHz
Power: 1.000 dBm Start: 33.04754301 GHz
Stop: 35.93999833 GHz x 1/1 — ⊗ — x 1/1 — In+LO
LO2
Start: 8.544234017 GHz
Stop: 8.544234017 GHz
Power: 9.000 dBm Start: 41.59177703 GHz
Stop: 44.48423234 GHz Output 41 — [Configure]
42 — [Configure]

TESTING OF A FREQUENCY CONVERTER DEVICE

BACKGROUND

The present invention concerns testing of electronic devices and pertains particularly to the testing of a frequency converter device.

A frequency converter device is used to convert a signal in one frequency range to a signal in another frequency range. For example, a typical frequency converter device uses a mixer to down-convert or up-convert an input signal to an output signal.

For a down-conversion of a high radio frequency (RF) signal to an intermediate frequency (IF) the mixer combines the RF signal with a local oscillator (LO) signal to produce a sum and a difference. The difference gives the down-converted signal.

For an up-conversion of an IF to an RF signal, the mixer combines the IF signal with the LO signal to produce a sum and a difference. The sum gives the up-converted signal.

Various types of testers can be used to test frequency converter devices. For example, a network analyzer can be used to provide input to and measure the output from a frequency converter device. Alternatively, any testing device with the capability to provide input to and measure the output from a frequency converter device can be used.

When stimulated at an input and LO (local oscillator) port, a frequency converting device produces a number of mixing products that show up at the output. These include not only the fundamental mixing products, but harmonics and spurs as well as leakage from the input and LO signals. The user of a tester is typically interested in both the desired output, termed the "fundamental" and one or more of the other mixing products.

When testing a frequency converter device, a user is generally required to specify to the testing device a frequency range of interest for the output signal of the frequency converter device. This can generally be derived from the input signal and the LO signal. However, performing the computations and then appropriately setting the testing device can be inconvenient and cumbersome. Additional complexity is added when determining the expected output from a frequency converter that includes more than one mixer.

SUMMARY OF THE INVENTION

In accordance with an embodiment of the present invention, a user interface is presented for a tester that tests a frequency converter having an input port, an output port and a local oscillator port. In a first area, a user can specify frequency for an input signal to be placed on the input port. In a second area, the user can specify frequency for a local oscillator signal to be placed on the local oscillator port. The tester calculates expected frequency values of an output signal on the output port output based on values entered in the first area and the second area.

DESCRIPTION OF THE PREFERRED EMBODIMENT

Figure 1:
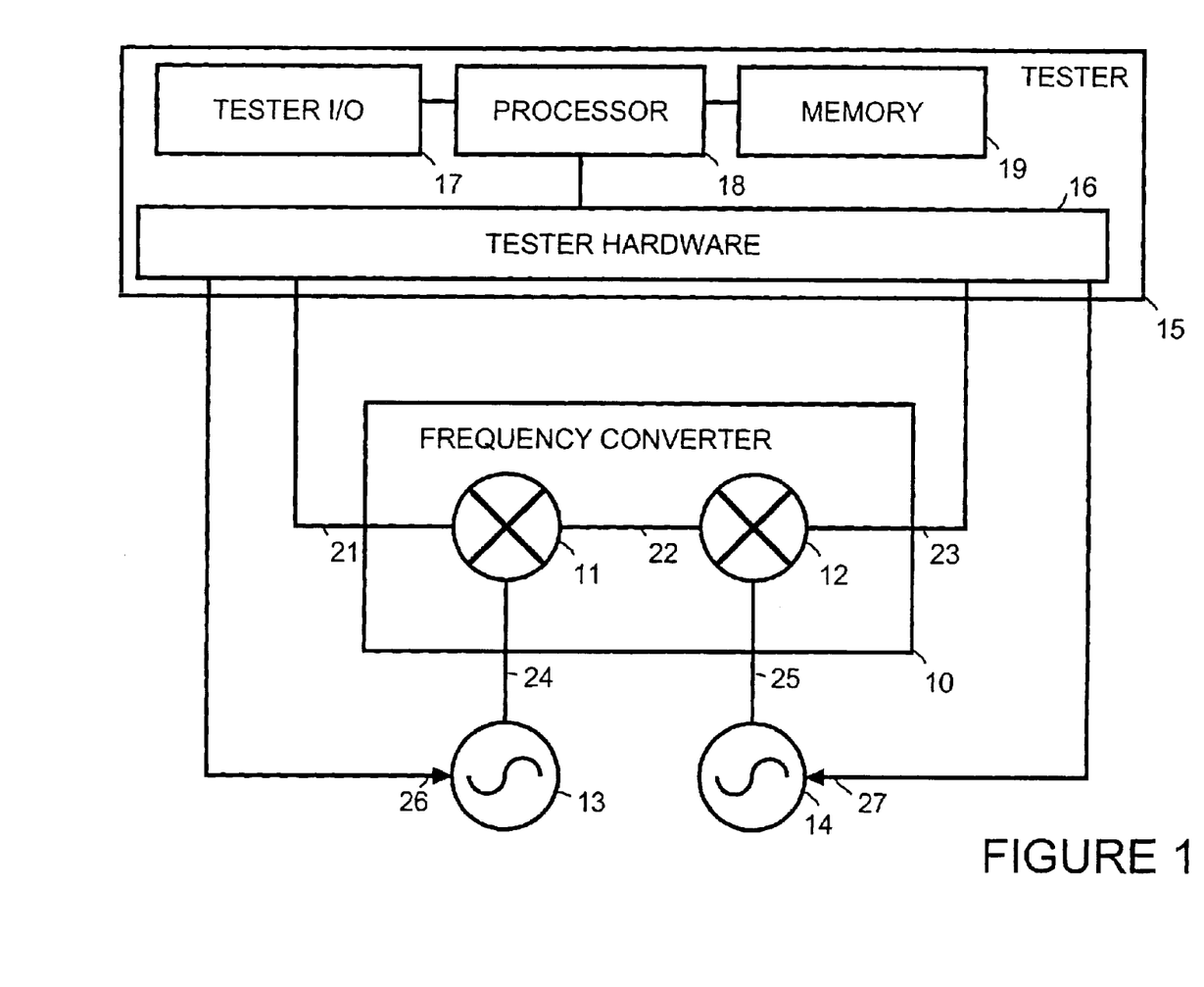
FIG. 1 is a simplified block diagram of a frequency converter and a tester.

FIG. 1 shows a frequency converter 10 and a tester 15. The frequency converter includes a first mixer 11 and a second mixer 12. The frequency converter has an input port 21, a first local oscillator (LO1) port 24, a second local oscillator (LO2) port 25 and an output port 23. An intermediate frequency (IF) signal is transferred on a line 22 from first mixer 11 to second mixer 12. A local oscillator 13 provides a first local oscillator (LO1) signal to LO1 port 24. A local oscillator 14 provides a second local oscillator (LO2) signal to LO2 port 25.

A tester 15 includes tester hardware 16, tester input/output (I/O) 17, a processor 18 and a memory 19. Tester hardware 21, for example, provides an input signal to input port 21 and measures an output signal on output port 23. Tester 15 controls local oscillator 13 via a control path 26. Tester 15 controls local oscillator 14 via a control path 27. Oscillator 13 and oscillator 14 may be external or internal to tester 15. Alternatively, depending on connections, tester 15 can stimulate any combination of ports and take measurements of resulting values on any combination of ports. For example, when performing an output match, tester 15 stimulates frequency converter 10 at output port 23 and measures the reflected signal at output port 23.

Figure 2:
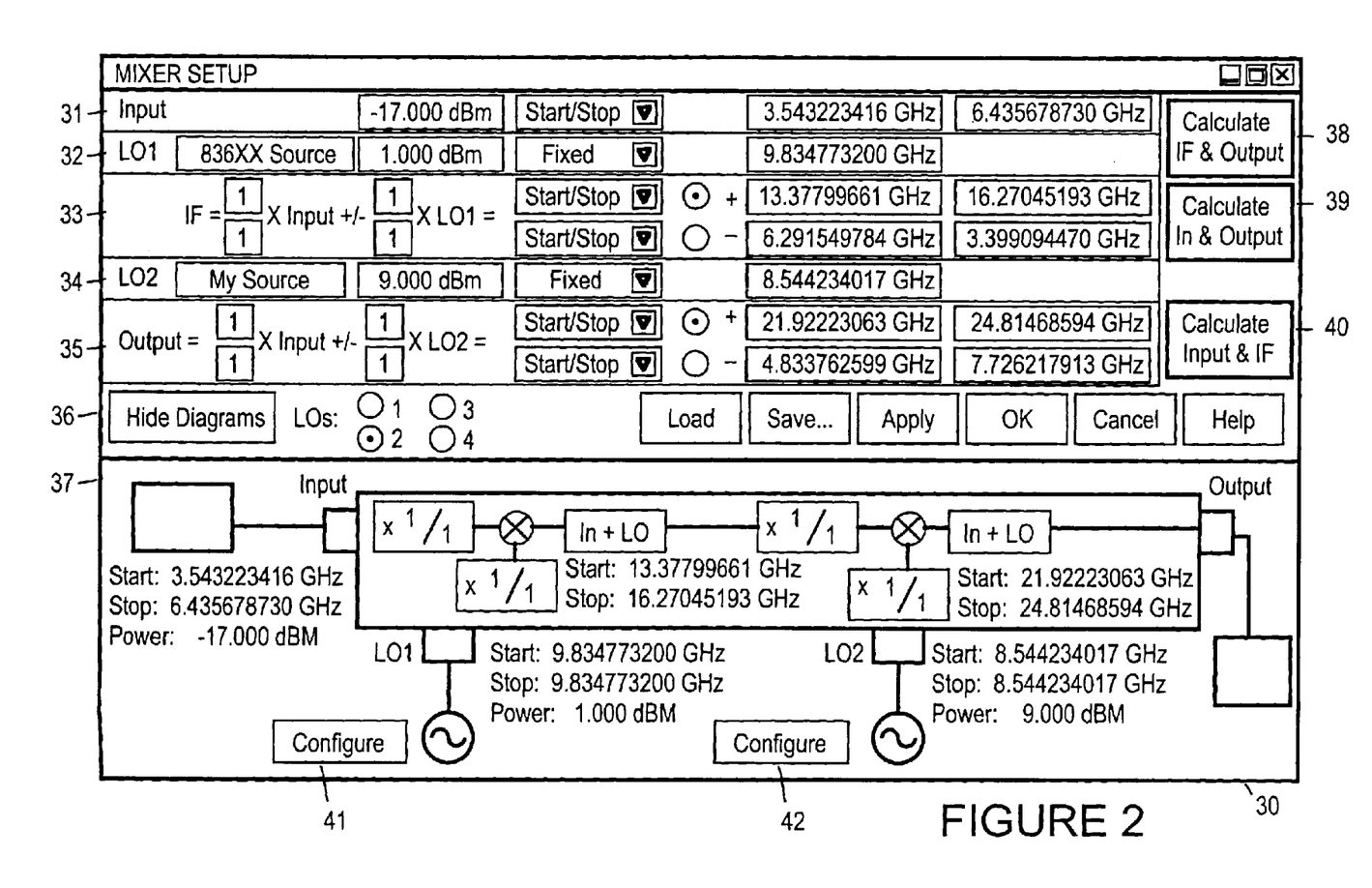
FIG. 2, FIG. 3, FIG. 4, FIG. 5 and FIG. 6 illustrate a graphics user interface for a tester in accordance with a preferred embodiment of the present invention.

FIG. 2 shows an example configuration interface display 30 generated by tester I/O 17, processor 18 and memory 19. In an area 31, a user can specify information about the input signal (Input) to be placed on input port 21 (shown in FIG. 1). The user can specify the input signal is fixed, can specify a specified frequency range, can specify a list of fixed frequencies or can specify a list of frequency ranges. Frequency range can be specified, for example, by selecting start and stop values, or by selecting a center frequency and a frequency span. In the example shown in FIG. 2, the frequency range of the Input signal is specified by start and stop values.

In an area 32, the user can specify information about the LO1 signal to be placed on LO1 port 24 (shown in FIG. 1). The user can specify the LO1 signal is fixed, can specify a specified frequency range, can specify a list of fixed frequencies or can specify a list of frequency ranges. In the example shown in FIG. 2, the user has selected a fixed frequency.

In an area 34, the user can specify information about the LO2 signal to be placed on LO2 port 25 (shown in FIG. 1). The user can specify the LO2 signal is fixed, can specify a specified frequency range, can specify a list of fixed frequencies or can specify a list of frequency ranges. In the example shown in FIG. 2, the user has selected a fixed frequency.

In an area 33, the user can specify information about the IF signal expected on line 22 (shown in FIG. 1). In an area 35, the user can specify information about the output signal expected on signal 23 (shown in FIG. 1).

An area 36 includes a Hide/Show button that allows a user to hide or show the diagram displayed in an area 37. In area 36, the user can specify whether the frequency converter to be tested has one local oscillator or two. In area 36 a user can also invoke a Load button, a Save button, an Apply button, an OK button, a Cancel button and a Help button. While in area 36 buttons are presented, as will be understood by persons of ordinary skill in the art, the buttons could be replaced with other types of commands that facilitate selection by a user. These could include, for example, pull down menus, special keyboard commands, etc.

Area 37 shows a diagram that presents to the user information about a test to be performed on a frequency converter. Area 37 also includes a Configure button 41, used for configuration of oscillator 13, and a Configure button 42, used for configuration of oscillator 14.

When the user has specified information about the input signal, the LO1 and the LO2 signal signal, the user can select calculate button 38 and tester 15 will calculate expected values for the output signal and expected values for the IF signal. The calculated values are displayed within configuration interface display 30. As will be understood by persons of Ordinary skill in the art, the calculate buttons could be replaced with other types of commands that facilitate selection by a user. These could include, for example, pull down menus, special keyboard commands, etc.

When the user has specified information about the expected IF signal, the LO1 signal and the LO2 signal, the user can select calculate button 39 and tester 15 will calculate the input signal and expected values for the output signal.

When the user has specified information about the expected output signal, the LO1 signal and the LO2 signal, the user can select calculate button 40 and tester 15 will calculate the input signal and expected values for the IF signal.

For example, a user desires to stimulate frequency converter 10 with the following values:

Input=3.543223416 GHz to 6.435678730 GHz at −17.0 dBm power

LO1=9.834773200 GHz at 1.0 dBm power

LO2=8.544234017 GHz at 9.0 dBm power

Additionally, the user wants to measure the following mixing products:

Fundamental desired output=|Input+LO1+LO2|

LO1 leakage

LO2 leakage

Input isolation $3^{rd}$ and $5^{th}$ harmonics

Spur table with 10 elements

To make these measurements, tester 15 provides signal stimulus to frequency converter 10 at input port 21, LO1 port 24 and LO2 port 25, and measures the response at output port 23. To set up the tests, the user must determine the frequency ranges for the desired mixing products to be measured and configure the tester 15 to stimulate frequency converter with the desired signals and measure the response in the appropriate frequency range. It is this task that configuration interface display 30 simplifies.

In the present example, frequency ranges must be calculated for each of the sixteen different frequency ranges mixing product that is desired. Every time any frequency is changed, all of the calculations need to be repeated.

As illustrated by FIG. 2, the user has entered in values for Input (3.543223416 GHz to 6.435678730 GHz at −17.0 dBm power) in area 31, values for LO1 (9.834773200 GHz at 1.0 dBm power) in area 32, and values for LO2 (8.544234017 GHz at 9.0 dBm power) in area 34.

Upon the user selecting calculate button 38, tester 15 placed in area 33 a frequency range for IF (13.37799661 GHz to 16.27045193 GHz) and placed in area 35 a frequency range for Output (21.92223063 GHz to 24.81468594 GHz).

In order to calculate these ranges, tester 15 uses the mixer equation set out below as Equation 1:

$$F_{Output} = ||F_{Input} +/- F_{LO1}| +/- F_{LO2}| \quad \text{Equation 1}$$

In equation 1, $F_{Output}$ is the output frequency, $F_{Input}$ is the input frequency $F_{LO1}$ is the LO1 frequency and $F_{LO2}$ is the LO2 frequency.

In area 33, "+" is selected if it is desired to measure the effects of $F_{Input}+F_{LO1}$. In area 33, "−" is selected if it is desired to measure the effects of $F_{Input}-F_{LO1}$. In area 34, "+" is selected if it is desired to measure the effects of $F_{IF}+F_{LO2}$. In area 34, "−" is selected if it is desired to measure the effects of $F_{IF}-F_{LO2}$.

Figure 3:
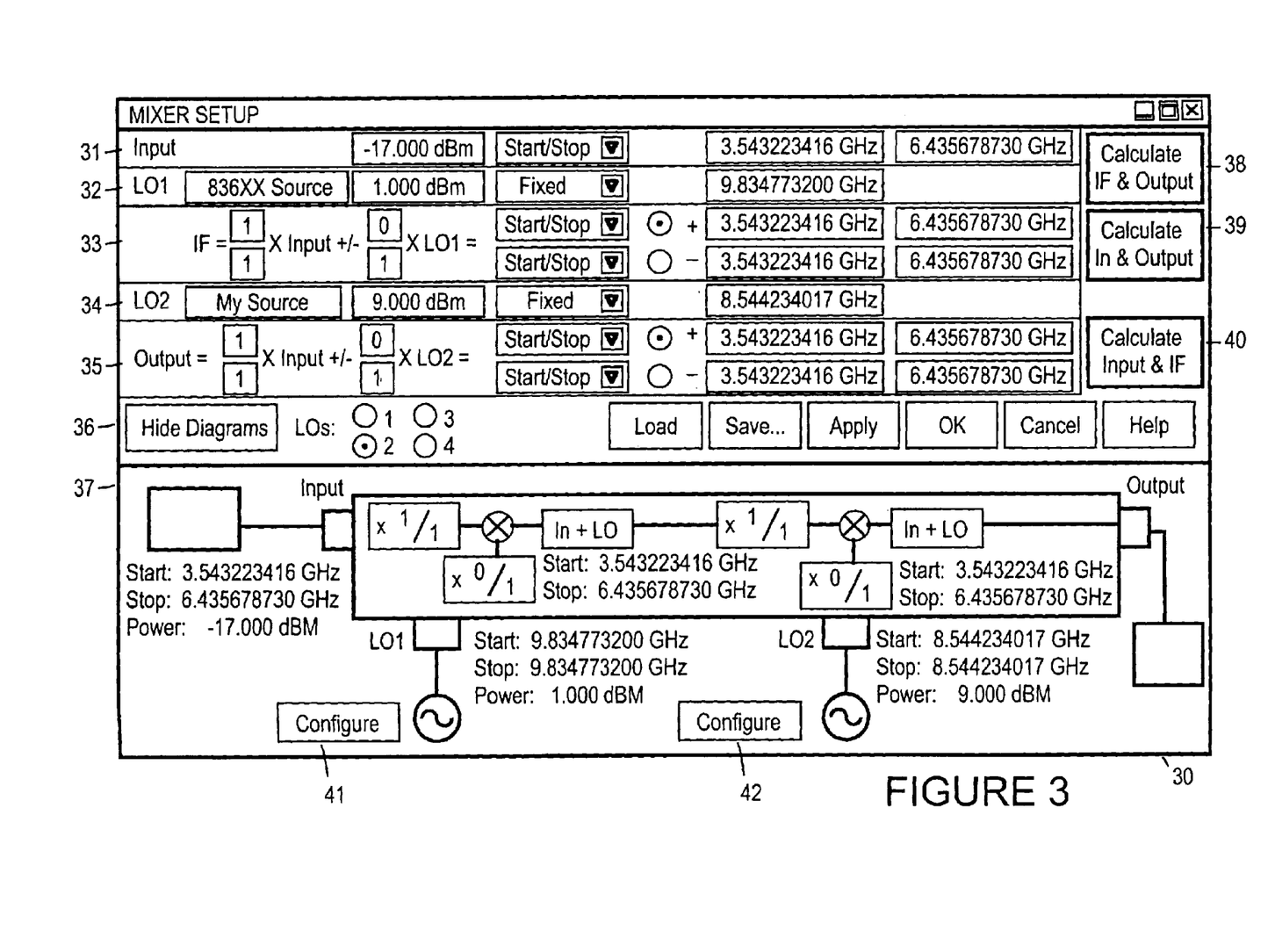

In area 33 and in area 35, multipliers can be used to instruct tester 15 to zero out some components. For example, as illustrated by FIG. 3, the multiplier in front of LO1 in area 33, and the multiplier in front of LO2 in area 35 can be made equal to zero in order to perform an "input leakage" measurement in dBm. By comparing the resulting measurement with a measurement of the output fundamental, the user can calculated the input leakage in decibels relative to carrier signal (dBc). A similar calculation could be performed for local oscillator leakage by setting the input multiplier in area 33 to zero.

Figure 4:
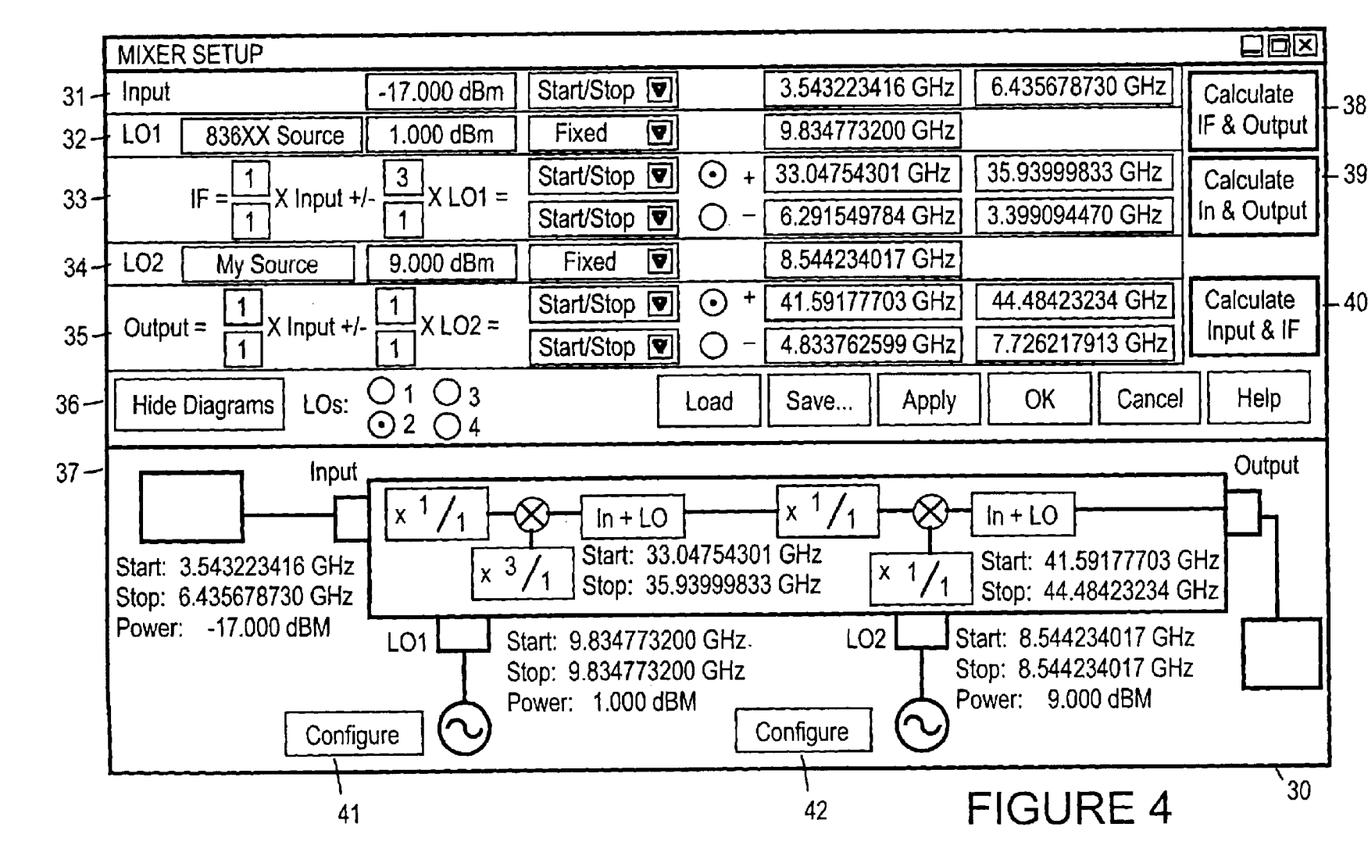

Also, setting the multipliers in area 33 and in area 35 to non-zero integers can be done to set tester 15 to measure harmonics or spurs. This is illustrated in FIG. 4.

In a preferred embodiment of configuration interface display 30, interface 30 enforces correct mixer from applying or accepting a mixer setup until the specified frequency values are consistent with equation 1 above. This is enforced by configuration interface display 30 not responding to user selection of the Apply button or the OK button in area 36 until the specified values are consistent. In order to make values consistent, a user merely has to select calculate button 38, calculate button 39 or calculate button 40 and configuration interface display 30 adjusts the appropriate values to make the listed values consistent with equation 1 above.

The diagram displayed in area 37 can be hidden by selecting the "Hide Diagrams" button in area 36. This allows configuration interface display 30 to be used at the time of measurement to make changes in real time that are immediately seen on a graph.

Figure 5:
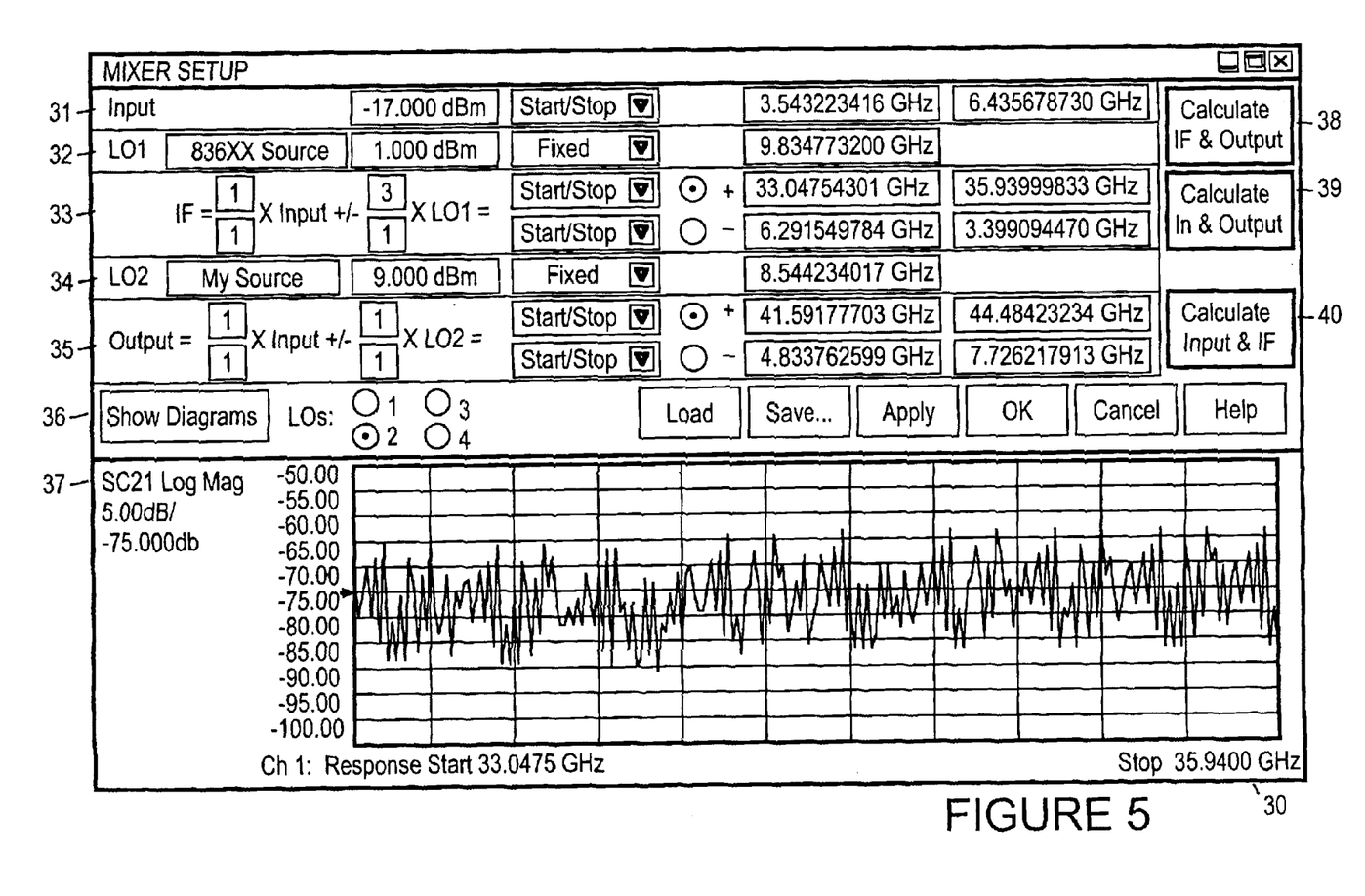

This is illustrated in FIG. 5 where during performance of measurements the diagram is hidden and real time measurements are shown in area 37. The "Hide Diagrams" button in area 36 is replaced by a "Show Diagrams" button.

Also in area 36, the user can select whether to perform a measurement using one local oscillator or two local oscillators. For example, when a frequency converter has only a single mixer, the user can select one local oscillator and configuration interface display 30 adjusts accordingly.

Figure 6:
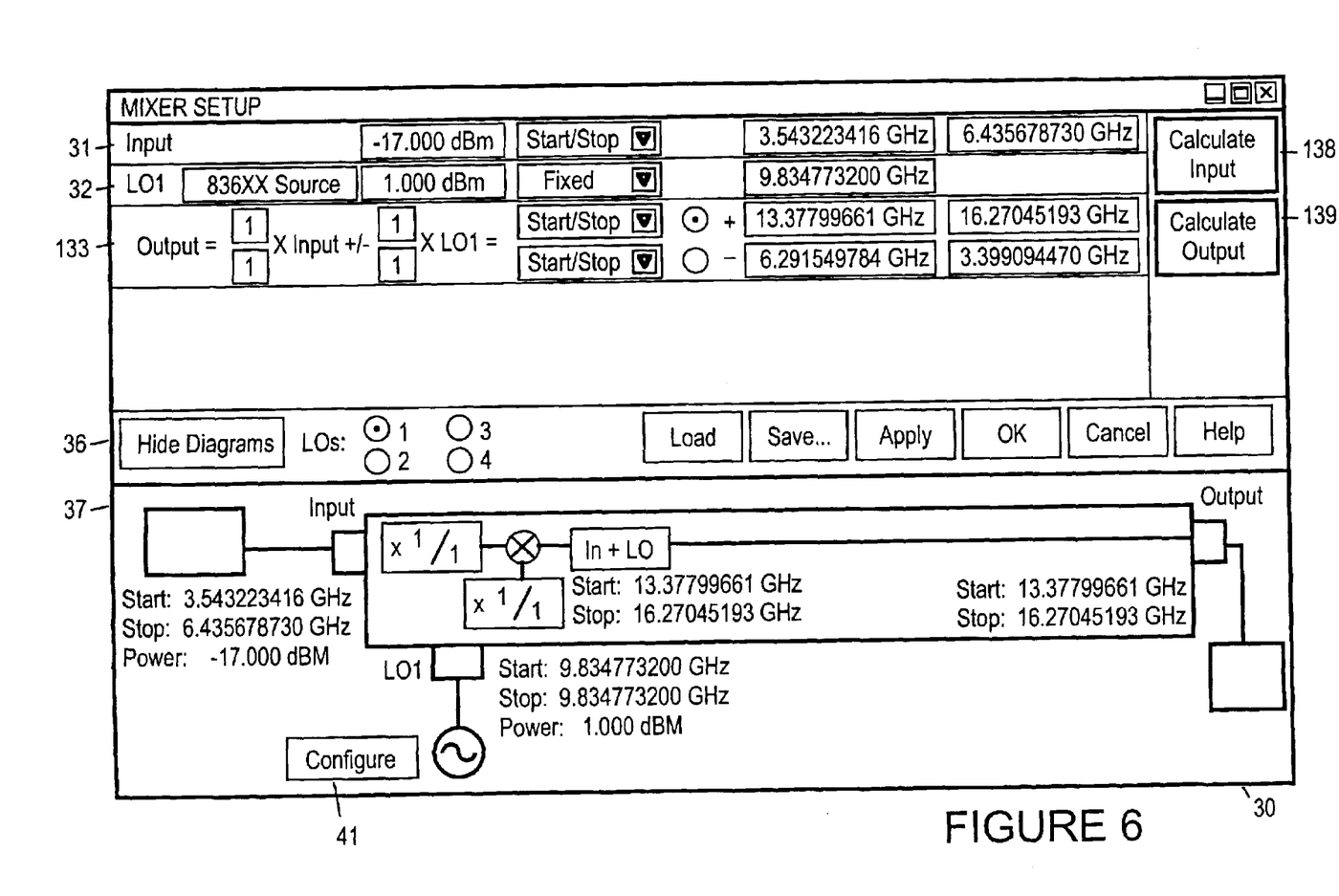

For example, FIG. 6 shows an example where a user has selected one local oscillator in area 36. In this case area 34 and area 35 are no longer needed, so they are removed from configuration interface display 30. Area 33 is replaced by area 133, as shown. Additionally, calculate buttons 38, 39 and 40 are replaced with new calculate button 138 (for calculating input) and new calculate button 139 (for calculating output). Additionally, the diagram within area 37 is adjusted to reflect a configuration that uses only one local oscillator.

Figure 7:
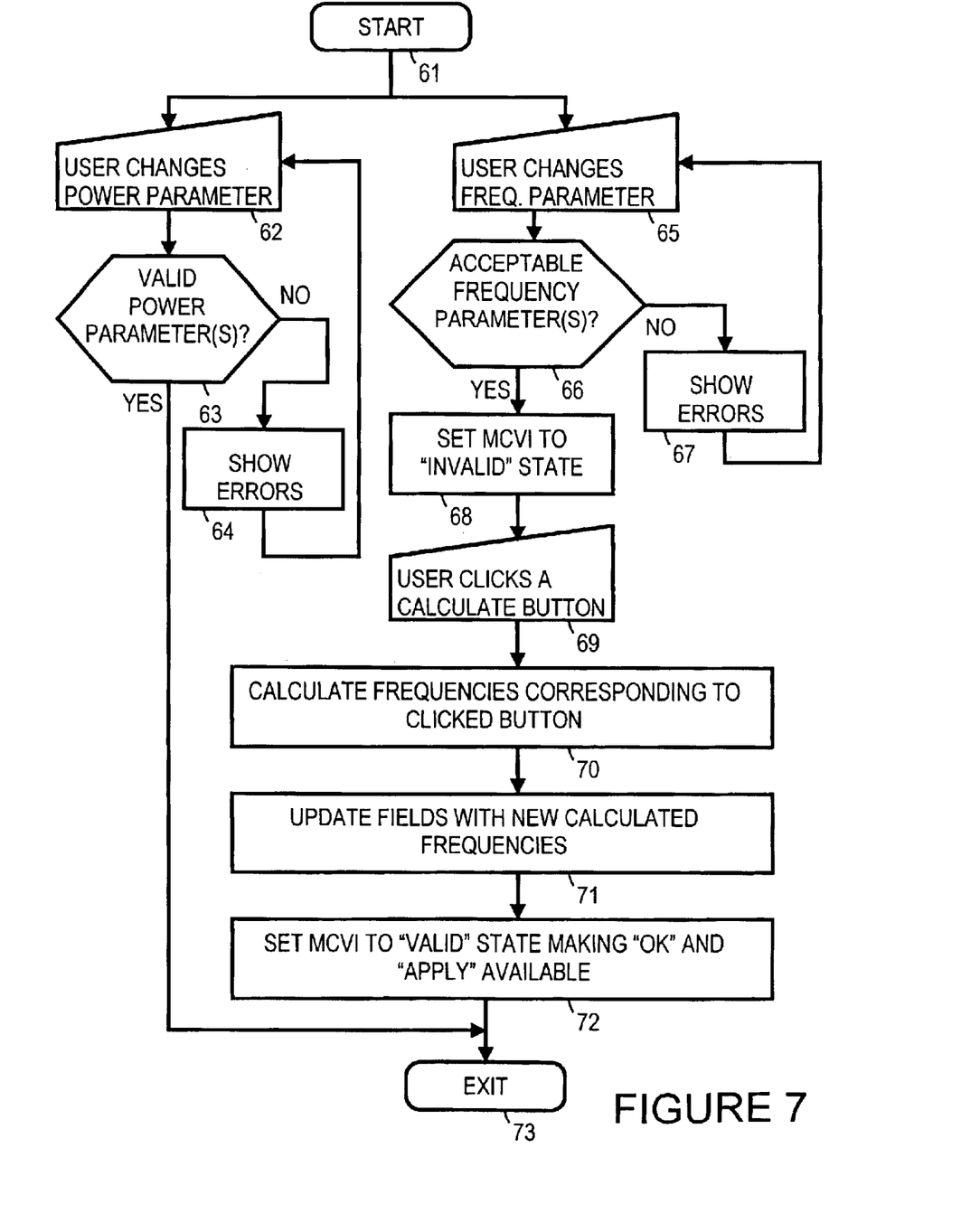
FIG. 7 is a simplified flowchart that illustrates operation of an interface display for a tester in accordance with a preferred embodiment of the present invention.

FIG. 7 is a simplified flowchart that illustrates operation of configuration interface display 30. In a block 61, in response to a user action, interface display 30 starts in a valid state, either from a loaded file or with "default" parameters.

In a block 62, the user action is a change of one or more power parameters. In a block 63, configuration interface display 30 runs validity checks on the entered powered parameters. If the entered power parameters are invalid, in a block 64, an error message is displayed to the user who is prompted to reenter the power parameters.

If in block 63 the validity tests show that the power parameters are valid, in a step 73, configuration interface display 30 saves the valid mixer configuration to memory and exits until the next user action.

In a block 65, the user action is a change of one or more frequency parameters. In a block 66, configuration interface display 30 runs checks on the entered frequency parameters. If the entered frequency parameters are unacceptable, in a block 67, an error message is displayed to the user who is prompted to reenter the power parameters.

If in block 66 the validity tests show that the power parameters are acceptable, in a block 68, configuration interface display 30 sets a mixer configuration validity indicator (MCVI) to an invalid state. When MCVI is in an invalid state, configuration interface display 30 does not respond to user selection of the Apply button or the OK button in area 36.

Block 69 represents a user selecting a calculate button (for example calculate button 38, 39 or 40 shown in FIG. 2). In a block 70, tester 15 calculates the frequencies specified by the calculate button, in accordance with Equation 1 above. In a block 71, display interface 30 updates the fields with new calculated frequencies.

In a block 72, display interface 30 sets MCVI to a valid state. When MCVI is in the valid state, configuration interface display 30 does respond to user selection of the Apply button or the OK button in area 36. In step 73, configuration interface display 30 saves the valid mixer configuration to memory and exits until the next user action.

Figure 8:
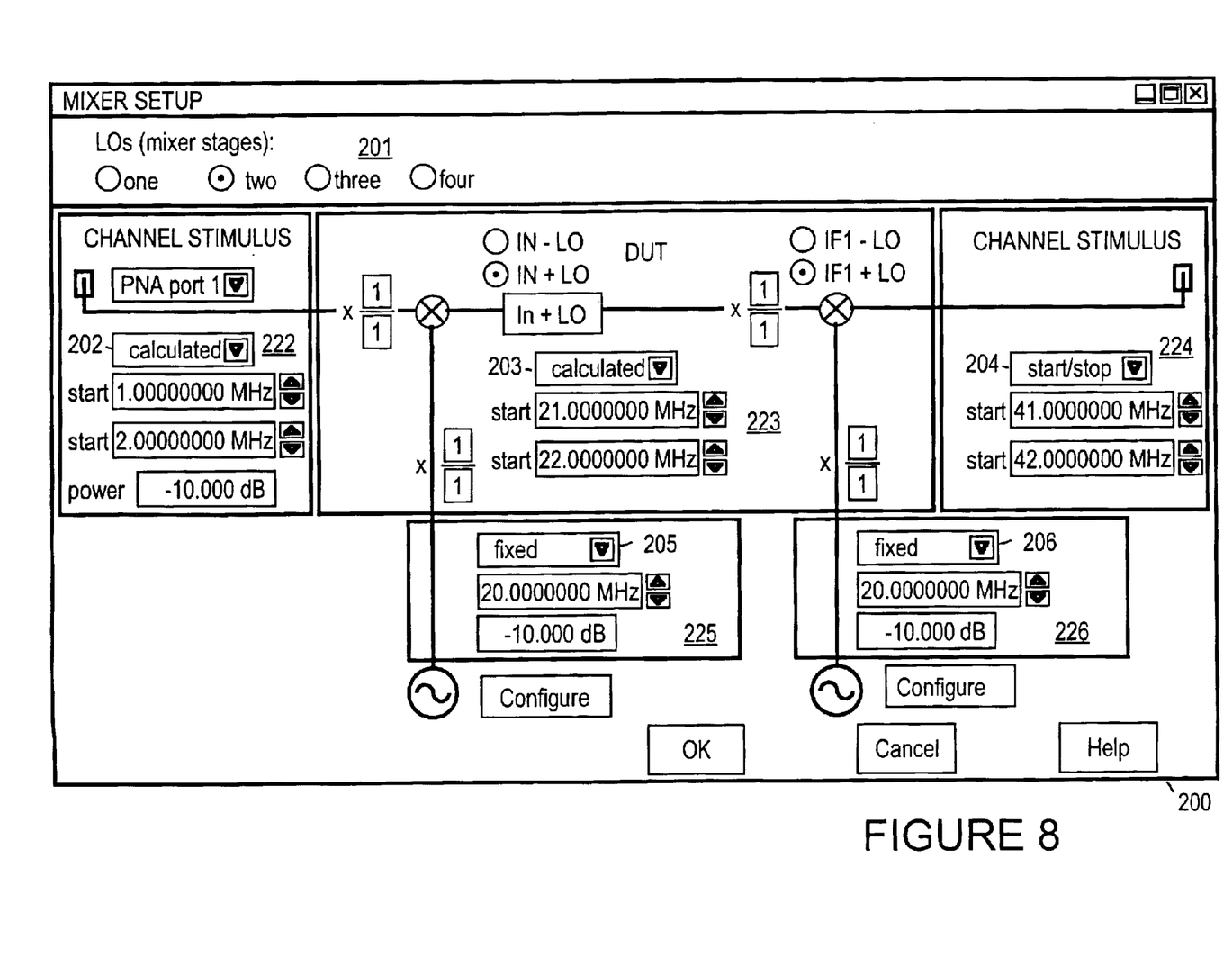
FIG. 8 illustrates a graphics user interface for a tester in accordance with an alternative preferred embodiment of the present invention.

FIG. 8 shows an example configuration interface display 200 generated by tester I/O 17, processor 18 and memory 19 in accordance with an alternative embodiment of the present invention. In configuration display interface 200, the user can specify the number of mixer states in an area 201. The user can specify or receive information about the Input signal in an area 222. The user can specify or receive information about the Output signal in an area 224. The user can specify or receive information about the IF signal in an area 224. The user can specify or receive information about a first local oscillating signal in an area 225. The user can specify or receive information about a second local oscillating signal in an area 226. When more than two local oscillators are specified, additional area appear to allow a user to specify or receive information about any additional local oscillators.

Within each area in which information can be specified or received about a signal, a pull down menu allows the user to specify whether the user is to supply the information about the signal or whether tester 15 will calculate the values. In area 222, the user uses menu 202 to supply information about the values of the Input signal or indicates tester 15 will calculate the values. In area 223, the user uses menu 203 to supply information about the values of the IF signal or indicates tester 15 will calculate the values. In area 224, the user uses menu 204 to supply information about the values of the Output signal or indicates tester 15 will calculate the values. In area 225, the user uses menu 205 to supply information about the values of the first local oscillator signal or indicates tester 15 will calculate the values. In area 226, the user uses menu 206 to supply information about the values of the second local oscillator signal or indicates tester 15 will calculate the values.

In the preferred embodiment, the user has the same options available in each of menus 202, 203, 204, 205 and 206. In each of these menus, the user can select "start/stop", "center/span", "fixed", "segment", or "calculated". By selecting "start/stop", the user can indicate a start frequency and a stop frequency for the signal. By selecting "center/span", the user can indicate a center frequency and a frequency span for the signal. By selecting "fixed", the user can indicate a single fixed frequency for the signal. By selecting "segment", the user can indicate a list of frequency ranges for the signal a list of fixed frequencies for the signal. By selecting "calculated", the user indicates that tester 15 will calculate the value for the frequency for the signal based on Equation 1 and the values of the other signals. In the preferred embodiment, the values for the calculated signals are immediately recalculated as values for the other signals are updated.

Figure 9:
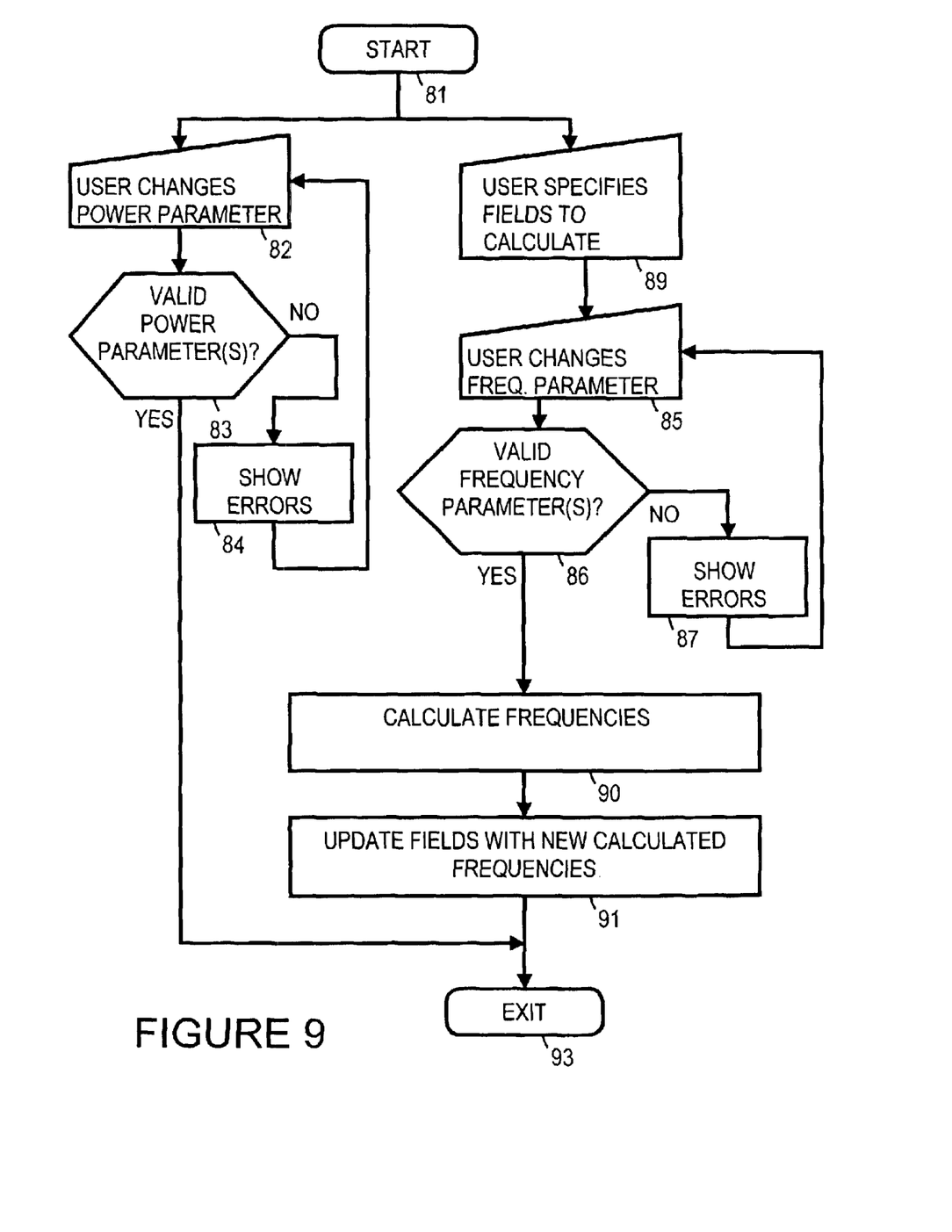
FIG. 9 is a simplified flowchart that illustrates operation of an interface display for a tester in accordance with an alternative preferred embodiment of the present invention.

FIG. 9 is a simplified flowchart that illustrates operation of configuration interface display 200. In a block 81, in response to a user action, interface display 200 starts in a valid state, either from a loaded file or with "default" parameters.

In a block 82, the user action is a change of one or more power parameters. In a block 83, configuration interface display 200 runs validity checks on the entered powered parameters. If the entered power parameters are invalid, in a block 84, an error message is displayed to the user who is prompted to reenter the power parameters.

If in block 83 the validity tests show that the power parameters are valid, in a step 93, configuration interface display 200 saves the valid mixer configuration to memory and exits until the next user action.

In a block 89, the user specifies fields to calculate. Typically, the user can specify up to one field to calculate per stage of the frequency converter. Fixed values or frequency fields must be specified for the remaining fields.

In a block 85, the user action is a change of one or more frequency parameters. In a block 86, configuration interface display 200 runs checks on the entered frequency parameters. If the entered frequency parameters are unacceptable, in a block 87, an error message is displayed to the user who is prompted to reenter the power parameters.

If in block 86 the validity tests show that the power parameters are acceptable, in a block 90, tester 15 calculates, in accordance with Equation 1 above, values for the fields specified, in block 89, to be calculated. In a block 91, display interface 200 updates the fields with new calculated frequencies.

In step 93, configuration interface display 200 saves the valid mixer configuration to memory and exits until the next user action.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A user interface of a tester that tests a frequency converter having an input port, an output port and a local oscillator port, the user interface comprising:
   a first area in which a user can specify frequency for an input signal to be placed on the input port; and,
   a second area in which the user can specify frequency for a local oscillator signal to be placed on the local oscillator port;
   wherein the tester calculates expected frequency values of an output signal on the output port output based on values entered in the first area and the second area.

2. A user interface of a tester as in claim 1 additionally comprising:
   a third area in which the user can specify expected frequency values of the output signal on the output port output;
   wherein the tester calculates frequency values for the input signal based on values entered in the second area and the third area.

3. A user interface of a tester as in claim 1 wherein in the first area and in the second area the user can specify a fixed frequency or a frequency range.

4. A user interface of a tester as in claim 1 wherein in the first area and in the second area the user can specify a list of fixed frequencies and can specify a list of frequency ranges.

5. A user interface of a tester as in claim 1 wherein the user can select a multiplier for the frequency specified for the input signal, and the user can select a multiplier for the frequency specified for the local oscillator signal.

6. A user interface of a tester as in claim 1 additionally comprising:
   a diagram area that shows a diagram of the frequency converter.

7. A user interface of a tester as in claim 1 wherein the tester calculates expected frequency values of an output signal as a result of the user selecting a command.

8. A user interface of a tester as in claim 1 wherein the tester calculates expected frequency values of an output signal as a result of the user adjusting a frequency value for a signal other than the output signal.

9. A user interface of a tester that tests a frequency converter having an input port, an output port, and a plurality of local oscillator ports, the user interface comprising:
   a first area in which a user can specify frequency for an input signal to be placed on the input port; and,
   a second area in which the user can specify frequency for a plurality of local oscillator signals to be placed on the plurality of local oscillator ports;
   wherein the tester calculates expected frequency values of an output signal on the output port output based on values entered in the first area, and the second area.

10. A user interface of a tester as in claim 9 wherein the tester additionally calculates expected frequency values of an intermediate signal between two mixers within the frequency converter based on values entered in the first area, and the second area.

11. A user interface of a tester as in claim 9 additionally comprising:
   a third area in which the user can specify expected frequency values of the output signal on the output port output;
   wherein the tester calculates frequency values for the input signal based on values entered in the second area and the third area.

12. A user interface of a tester as in claim 9 additionally comprising:
   a third area in which the user can specify expected frequency values of the output signal on the output port output;
   wherein the tester calculates frequency values for the input signal based on values entered in the second area and the third area, and calculates expected frequency values of an intermediate signal between two mixers within the frequency converter based on values entered in the second area and the third area.

13. A user interface of a tester as in claim 9 additionally comprising:
   a third area in which the user can specify expected frequency values of an intermediate signal between two mixers within the frequency converter;
   wherein the tester calculates frequency values for the input signal and the output signal based on values entered in the second area and the third area.

14. A user interface of a tester as in claim 9 wherein in the first area and the second area the user can specify a fixed frequency or a frequency range.

15. A user interface of a tester as in claim 9 wherein in the first area and the second area the user can specify a list of fixed frequencies or a list of frequency ranges.

16. A user interface of a tester as in claim 9 wherein the user can select a multiplier for the frequency specified for the input signal, the user can select a multiplier for the frequency specified for each local oscillator signal and the user can select a multiplier for the frequency specified for the second local oscillator signal.

17. A user interface of a tester as in claim 9 additionally comprising:
   a diagram area that shows a diagram of the frequency converter.

18. A method by which a user interface allows configuration of a tester to test a frequency converter that has an input port, an output port and a local oscillator port, the method comprising the following steps:
   (a) receiving from a user first information specifying frequency for an input signal to be placed on the input port;
   (b) receiving from the user second information specifying frequency for a local oscillator signal to be placed on the local oscillator port; and,
   (c) calculating expected frequency values of an output signal on the output port based on the first information and the second information.

19. A method by which a user interface allows configuration of a tester to test a frequency converter that has an input port, an output port and a local oscillator port, the method comprising the following steps:
   (a) receiving from a user first information specifying expected frequency for an output signal on the output port;
   (b) receiving from the user second information specifying frequency for a local oscillator signal to be placed on the local oscillator port; and,
   (c) calculating frequency values for an input signal to be placed on the input port based on the first information and the second information.

20. A method by which a user interface allows configuration of a tester to test a frequency converter that has an input port, an output port and a plurality local oscillator ports, the method comprising the following steps:

(a) receiving from a user first information specifying frequency for an input signal to be placed on the input port;

(b) receiving from the user second information specifying frequency for each local oscillator signal to be placed on each of the plurality of local oscillator ports; and, (c) calculating expected frequency values of an output signal on the output port based on the first information and the second information.

21. A method as in claim 20 wherein step (c) additionally includes calculating frequency values for an intermediate signal between two mixers within the frequency converter based on the first information, the second information and the third information.

22. A method by which a user interface allows configuration of a tester to test a frequency converter that has an input port, an output port and a plurality of local oscillator ports, the method comprising the following steps:

(a) receiving from a user first information specifying expected frequency for an output signal on the output port;

(b) receiving from the user second information specifying frequency for each local oscillator signal to be placed on each of the plurality of local oscillator ports; and, (c) calculating frequency values for an input signal to be placed on the input port based on the first information and the second information.

23. A method as in claim 22 wherein step (c) additionally includes calculating frequency values for an intermediate signal between two mixers within the frequency converter based on the first information and the second information.

24. A method by which a user interface allows configuration of a tester to test a frequency converter that has an input port, an output port and a plurality of local oscillator ports, the method comprising the following steps:

(a) receiving from a user first information specifying expected frequency for an intermediate signal between two mixers within the frequency converter;

(b) receiving from the user second information specifying frequency for each first local oscillator signal to be placed on each of the plurality of local oscillator ports; and, (c) calculating frequency values for an input signal to be placed on the input port and expected frequency values of an output signal on the output port based on the first information and the second information.

25. A method by which a user interface allows configuration of a tester to test a frequency converter that has an input port, an output port, and at least one local oscillator port, the method comprising the following steps:

(a) accepting from a user, an indication as to signals for which the tester is to calculate signal frequencies;

(b) accepting from the user, values for signal frequencies for signals for which the tester is not to calculate signal frequencies; and, (c) calculating values of signal frequencies for signals for which the tester is to calculate signal frequencies based on values accepted from the user for signals for which the tester is not to calculate signal frequencies.

26. A method as in claim 25 wherein in step (b) the user specifies the values for signal frequencies for signals for which the tester is not to calculate signal frequencies by specifying at least one of the following:

a fixed frequency;

a range of frequencies;

a list of fixed frequencies; and, a list of frequency ranges.

* * * * *